(12) United States Patent
Sicard

(10) Patent No.: US 10,516,392 B2
(45) Date of Patent: Dec. 24, 2019

(54) IGBT GATE CURRENT SLOPE MEASURE TO ESTIMATE MILLER PLATEAU

(71) Applicant: NXP USA, Inc., Austin, TX (US)

(72) Inventor: Thierry Sicard, Auzeville tolosane (FR)

(73) Assignee: NXP USA, INC., Austin, TX (US)

( * ) Notice: Subject to any disclaimer, the term of this patent is extended or adjusted under 35 U.S.C. 154(b) by 333 days.

(21) Appl. No.: 15/633,953

(22) Filed: Jun. 27, 2017

(65) Prior Publication Data

US 2018/0013416 A1    Jan. 11, 2018

(30) Foreign Application Priority Data

Jul. 11, 2016 (EP) ..................................... 16305876

(51) Int. Cl.
| | | |
|---|---|---|
| *H02H 3/00* | (2006.01) | |
| *H03K 17/081* | (2006.01) | |
| *H03K 17/16* | (2006.01) | |
| *H01L 29/739* | (2006.01) | |

(52) U.S. Cl.
CPC .... *H03K 17/08116* (2013.01); *H01L 29/7393* (2013.01); *H03K 17/163* (2013.01); *H03K 17/168* (2013.01)

(58) Field of Classification Search
None
See application file for complete search history.

(56) References Cited

U.S. PATENT DOCUMENTS

| | | | | |
|---|---|---|---|---|
| 6,459,324 | B1* | 10/2002 | Neacsu | ............... H03K 17/168 |
| | | | | 327/379 |
| 9,812,941 | B2* | 11/2017 | Sicard | .................... H02M 1/08 |
| 2002/0070772 | A1 | 6/2002 | Neacsu et al. | |
| 2015/0028923 | A1* | 1/2015 | Peng | ................... H03K 17/166 |
| | | | | 327/109 |

FOREIGN PATENT DOCUMENTS

| | | |
|---|---|---|
| EP | 3 035 532 A1 | 6/2016 |
| WO | WO-2008/032113 A1 | 3/2008 |

OTHER PUBLICATIONS

Lobsiger, Yanick: "Closed-loop IGBT Gate Drive Featuring Highly Dynamic di/dt and dv/dt Control", IEEE Energy Conversion Congress and Exposition (ECCE); pp. 4754-4761 (Feb. 15, 2012).

* cited by examiner

*Primary Examiner* — Stephen W Jackson

(57) ABSTRACT

A method and apparatus are provided for controlling a drive terminal of a power transistor by applying a turn-off voltage to the drive terminal at a turn-off time, measuring a gate current at the drive terminal to detect a predetermined gate current slope, determining a first time increment after the turn-off time when the predetermined gate current slope is detected, determining a second time increment which is proportional to the first time increment and which expires within a Miller plateau for the power transistor, and lowering the gate current at the drive terminal to a predetermined current level upon expiration of the second time increment in order to reduce overvoltages at the power transistor.

15 Claims, 8 Drawing Sheets

IGBT GATE CURRENT SLOPE MEASURE TO ESTIMATE MILLER PLATEAU

CROSS-REFERENCE TO RELATED APPLICATIONS

This application claims the priority under 35 U.S.C. § 119 of European patent application no. 16305876.1, filed Jul. 11, 2016 the contents of which are incorporated by reference herein.

BACKGROUND OF THE INVENTION

Field of the Invention

The invention relates generally to the field of semiconductor devices. In one aspect, the present invention relates to the control and operation of insulated-gate bipolar transistors.

Description of the Related Art

Power Metal Oxide Semiconductor Field Effect Transistors (MOSFETs) and Insulated Gate Bipolar Transistors (IGBTs) have established themselves as premier power semiconductors in a wide range of applications involving switching or amplification. However, effective use of these devices requires a balance of performance outcomes (e.g., switching speed) against device effects (e.g., overvoltages). For example, during turn-off of a power transistor, overvoltages generated across the power transistor (e.g., between the collector and emitter terminals of an IGBT) may cause the destruction of the power transistor or excessively high electromagnetic interferences. This can occur during rapid turn-off of a power transistor with low switching losses when an internal capacitance (e.g., a gate-emitter capacitance in an IGBT) is discharged in a few hundreds of nanoseconds via a current of several amperes flowing from the internal capacitance through the gate control terminal. In addition, parasitic inductances between the internal capacitance and the control terminal may cause unexpected oscillations that can create even stronger electromagnetic interferences. Conventional approaches for solving the overvoltage problems include connecting a small external resistor (e.g., a few ohms) in series with the gate control terminal of the power transistor to limit the discharge current during turn-off while also limiting overvoltages across the power transistor, but such solutions degrade the overall turn-off time of the power transistor since the switching losses associated with the turn off of the power transistor are increased by the external resistor. Other solutions include using an active voltage control to control the turn-off of the IGBT by generating an intermediate gate voltage-level between a full turn-on gate control voltage and a full turn-off gate control voltage in order to reduce the overvoltages across the IGBT and at the same time maintaining the overall turn-off time within acceptable levels. However, a problem associated with this solution is that a complex feedback control loop is required to generate the intermediate gate voltage levels by adaptively adjusting the gate control voltage as a function of a detected slope change in the output voltage, i.e., the collector voltage in an IGBT, of the power transistor. And while the timing of the intermediate gate voltage-level could be controlled with a simple timer, a fixed timer approach would not account for IGBT process and/or temperature variations. Another approach for preventing overvoltages would be to measure the voltage across the IGBT collector and emitter (Vce), but this voltage is difficult to measure since the signal is noisy and the measured threshold should be a few volts which must be taken across the high voltage diode. As a result, the existing solutions for controlling the turn-off of an IGBT device are extremely difficult at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

A gate drive circuit and method for controlling a power transistor are described for using a gate current slope measurement to estimate the Miller plateau start time to implement a controlled turn-off of the transistor by reducing the gate current at the estimated start time to prevent voltage overshoot for the power transistor while reducing the turn-off delay time to address various problems in the art where limitations and disadvantages of conventional solutions and technologies will become apparent to one of skill in the art after reviewing the remainder of the present application with reference to the drawings and detailed description provided herein. In selected embodiments, a gate drive circuit drives a control terminal of a power transistor with an active gate current control that employs a controlled turn-off sequence to generate, during turn-off of the power transistor, a controlled or reduced gate current-level that occurs between a full turn-on gate control voltage and a full turn-off gate control voltage in order to reduce the overvoltages across the power transistor and at the same time maintain the overall turn-off time within acceptable levels. The timing for generating the reduced gate current-level is controlled by using a current measurement circuit to determine a first time increment (Δt1) between the initiation of the turn-off sequence at the control terminal and the detection of a predetermined slope measure for the gate current, and by using a proportional timer circuit to determine a second time increment (Δt2=k Δt1) which is proportional to the first time increment by a factor k which is a circuit-based adjustment to account for variations in the transistor fabrication process and/or temperature. The combined first and second time increments provide an estimate of the start of the Miller plateau when internal gate voltage $V_{GE}$ is substantially constant and the rate of gate current change at the internal gate (e.g., $dI_G/dt$) is substantially unchanging or flat. By delaying the reduction of the IGBT gate current-level until after expiration of the first and second time increments, the rate of gate current change (e.g., di/dt) becomes almost flat due to the Miller plateau which is the period of time during which the internal gate-to-emitter voltage $V_{Gin}$ is constant because the internal gate terminal Gin is clamped until sufficient charge is removed from the gate emitter capacitance $C_{GE}$ to fully turn-off the IGBT. In this way, the power transistor is turned off very quickly by discharging the IGBT gate as fast as possible with the large gate current until such time as the gate current is reduced before the $V_{CE}$ goes up quickly so as to prevent the maximum $V_{CE-MAX}$ level from being exceeded. By determining the first and second time increments, the power transistor device operates during the Miller plateau when the $V_{CE}$ increases with a very slow slope.

Figure 1:
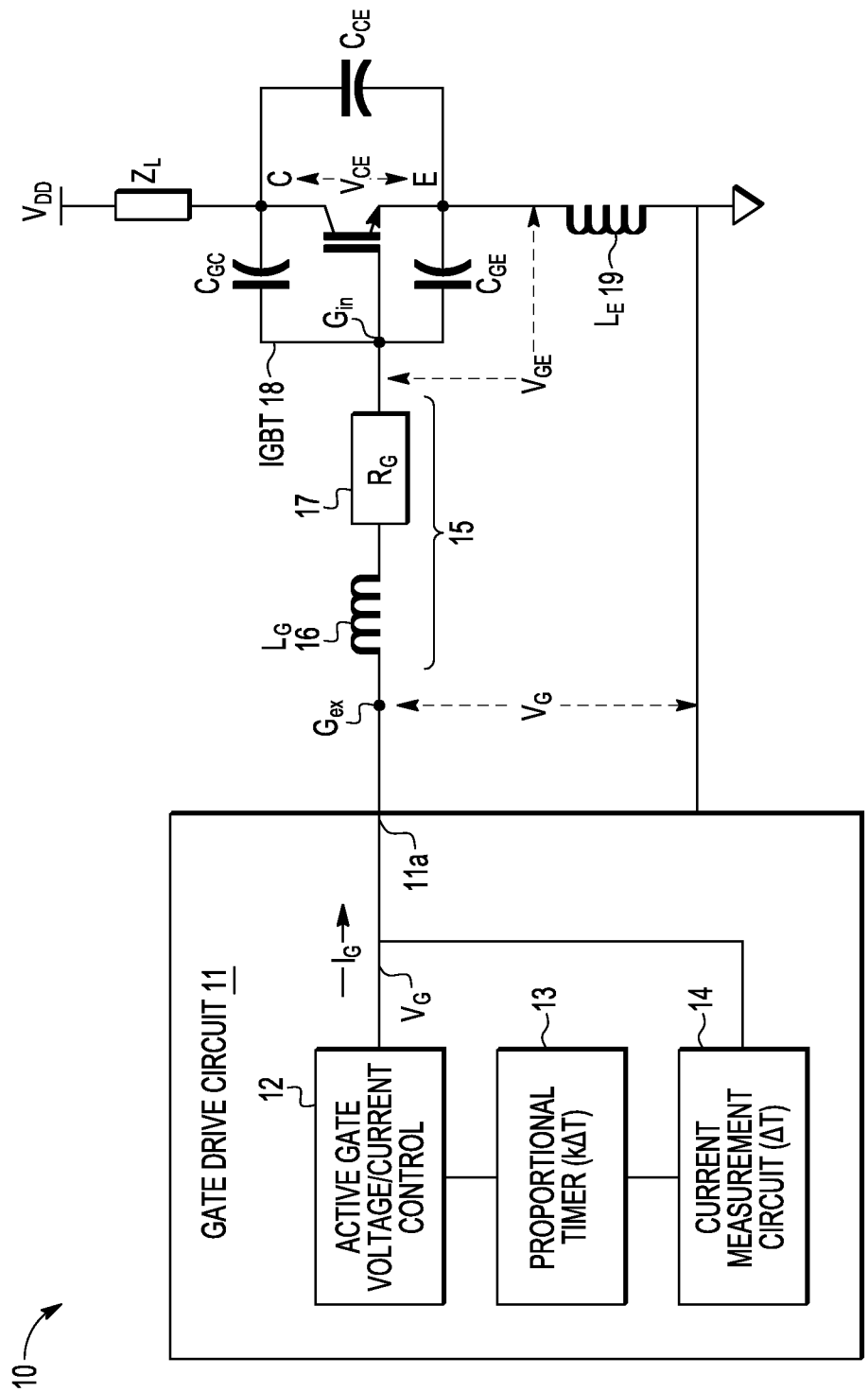
FIG. 1 is a schematic illustration of a gate drive circuit and power transistor in accordance with selected embodiments of the present disclosure.

Referring now to FIG. 1, there is shown a block diagram illustration of a gate drive circuit 11 and power transistor 18 in accordance with selected embodiments of the present disclosure. The gate drive circuit 11 has a drive terminal 11a electrically coupled to drive a control terminal Gex of the power transistor 18. The illustrated power transistor 18 may be an Insulated Gate Bipolar Transistor (IGBT) with a gate terminal Gex, an internal gate terminal Gin, an emitter terminal E, and a collector terminal C, thought any suitable type of power transistor, such as a power n-MOSFET, in which case the emitter terminal E is a source terminal and the collector terminal C is a drain terminal.

The control terminal Gex may be electrically coupled to the internal control terminal Gin of the power transistor 18 by means of a parasitic component 15. The parasitic component 15 may include a parasitic inductance $L_G$ 16 resulting from the connection inductance between the control terminal Gex and the drive terminal 11a. The parasitic component 15 may also include an internal distributed gate resistance $R_G$ 17 for the power transistor 18 resulting from the contact resistance between the internal control terminal Gin and the control terminal Gex. The power transistor 18 may also include an additional parasitic inductance component LE 19 resulting from the connection inductance between the emitter E and the ground reference voltage.

The control terminal Gex may be an external gate terminal accessible by circuits external to the power transistor 18, such as the gate drive circuit 11. At the power transistor 18, an internal gate-to-emitter capacitance $C_{GE}$ exists between the internal control terminal Gin and the emitter terminal E. In similar fashion, the power transistor 18 includes an internal gate-to-collector capacitance $C_{GC}$ between the internal control terminal Gin and the collector terminal C power, as well as an internal collector-to-emitter capacitance $C_{CE}$ between the collector terminal C and the emitter terminal E. In a sense, the internal capacitors $C_{GC}$, $C_{GE}$, $C_{CE}$ may be viewed as parasitic capacitances insofar as they limit the speed of the IGBT commutation, though they may also be considered to be part of the IGBT component itself, and therefore would not be considered as parasitic capacitances in a conventional sense.

Figure 2:
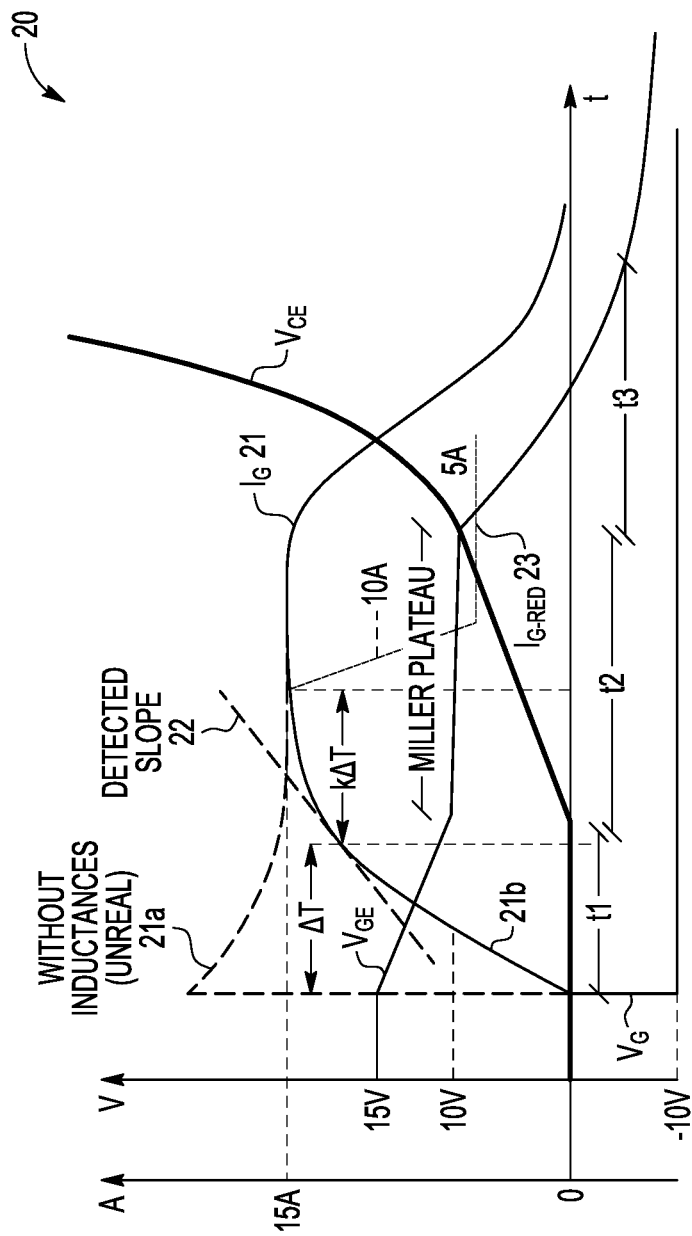
FIG. 2 shows a timing diagram of the voltage and current signals for the example shown in FIG. 1.

To drive the power transistor 18, the gate drive circuit 11 includes an active gate voltage/current control 12, a current measurement circuit 14, and a proportional timer circuit 13. The active gate voltage/current control 12 generates a gate voltage signal $V_G$ that is output to the drive terminal 11a for connection to the control terminal Gex of the power transistor 18. Using one or more reference voltages (e.g., Vref1=15V and Vref2=−10V) and a connection switch (not shown) which is arranged to electrically switch the drive terminal 11a from the first reference voltage Vref1 to the second reference voltage Vref2, the gate drive circuit 11 is connected to drive the control terminal Gex when turning OFF the power transistor 18, as shown in FIG. 2 when the gate voltage signal $V_G$ transitions from 15V to −10V. It is during switching of the IGBT 18 to turn the device OFF that selected embodiments of the present disclosure may be applied for use in any suitable applications where efficiency is important. For example, the IGBT 18 may be employed in power inverter used to control a three-phase motor, where the fast switching speeds obtained from the gate drive circuit 11 are desired to reduce the commutation losses by quickly turning OFF the IGBT 18. Though not shown, it will be appreciated that circuitry separate from the active gate voltage/current control 12 may be employed to switch ON the IGBT 18.

To facilitate a controlled turn-off of the power transistor 18, the gate drive circuit 11 includes a current measurement circuit 14 with a measurement input connected to the drive terminal 11a for measuring the gate current $I_G$ at the control terminal Gex. In selected embodiments, the measurement circuit 14 measures the rate of change for the gate current by calculating the slope of the gate current $I_G$, and then determines a first time increment measure (Δt) between the initiation of the turn-off sequence at the control terminal Gex and the detection of a predetermined slope measure (e.g., 45°) for the gate current $I_G$. The first time increment measure is output to the proportional timer circuit 13 for use in generating a second time increment measure (kΔt) which is used to generate a control signal that is connected to a control input of the active gate voltage/current control 12 for purposes of controlling the timing of when the gate current $I_G$ 21 is reduced ($I_{G-RED}$ 23) to a predetermined gate current (e.g., from 15 A to 5 A) to prevent the collector-to-emitter voltage $V_{CE}$ from exceeding a specified maximum voltage $V_{CE-MAX}$ while simultaneously maintaining the overall turn-off time within acceptable levels. To this end, the active gate voltage/current control 12 may be configured to drive the gate current through several switches which are connected in parallel to provide maximum gate current when all switches may be turned ON, and to provide one or more reduced gate current levels when one or more of the switches are turned OFF. In an example embodiment, three separate switches associated with different gate current levels (e.g., 1 A, 4 A, and 28 A) may be connected in parallel in a low side power switch between the IGBT gate current and the emitter node to generate three different gate current levels. When a reduced gate current is needed, one or more of the switches are closed. In other embodiments, a multi-switch configuration may be used for applying first and second reference sources as voltages to the drive terminal and for driving the current terminal with a fixed (reduced) current source upon expiration of the time increment.

When fully turned off, the power transistor 18 is in a non-conducting state so that, except for any leakage current, current does not flow in the transistor's conducting path between the collector terminal C and the emitter terminal E. However, a full turn-off of the power transistor 18 will not occur instantaneously after changing the voltage applied to the control terminal Gex due to the internal capacitances $C_{GE}$, $C_{CE}$, $C_{GC}$. This is illustrated with FIG. 2 which shows a timing diagram 20 of the voltage and current signals for the example shown in FIG. 1 where there is a time delay or transition period when the power transistor 18 transits from an ON-state to an OFF-state and when there is a large current flowing through the power transistor 18 and after which the power transistor 18 is fully turned-off.

As understood by those skilled in the art, there is a known relationship between the gate current $I_G$ flowing into the parasitic component 15, the internal gate voltage $V_GE$ at the internal control terminal Gin, and the voltage $V_{CE}$ across the current terminals of the power transistor. For example, FIG. 2 shows that the voltage VCE does not initially change as the gate voltage signal $V_G$ initially transitions from 15V to −10V during the first transition time period t1. However, the IGBT gate current $I_G$ increases very quickly and the internal gate voltage $V_GE$ decreases linearly during this first transition period t1 until reaching the Miller plateau, at which point the IGBT gate current rate of change becomes almost flat (low $dI_G/dt$) because the voltage across the internal gate resistance $R_G$ is almost constant. As the turn off is really fast (e.g., hundreds of 100 ns), the small gate inductance $L_G$ (e.g., 10 nH) limits the initial $dI_G/dt$, as indicated with the gate current 21b (real) in contrast to the plot for the gate current 21a without inductances (unreal). After the first transition period t1, the voltage $V_{CE}$ begins to desaturate as the IGBT gate current rate of change decreases during a second transition period t2 when the gate current slope becomes essentially flat, indicating that the internal gate has reached the Miller plateau. The low slope of the voltage $V_{CE}$ is in phase with the Miller plateau on the gate as the gate capacitance discharges because, during the second transition period t2, $V_{CE}$ goes up while $V_{GE}$ is constant. However, after desaturation, the voltage $V_{CE}$ begins to increase significantly or exponentially during a third transition period t3, which can rapidly exceed a specified maximum voltage (e.g., $V_{CE-MAX}$).

As illustrated in FIG. 2, the start of the Miller plateau may be approximately located by detecting a first measured time period $\Delta t$ when the gate current slope reaches a predetermined value (e.g., 45 degrees), indicating that the gate current has transitioned from a fast slope to a slow slope. However, due to variations in the device fabrication process and/or temperature parameters, the first measured time period $\Delta t$ does not correspond precisely to the first transition period t1 which identifies the beginning of the Miller plateau (e.g., $\Delta t < t1$). As a result, some sort of adjustment or increment to the first measured time period $\Delta t$ should be made.

In order to estimate the location of the Miller plateau in a way that is not affected by IGBT parameter dispersion, the current measurement circuit 14 and proportional timer circuit 13 are provided to determine, respectively, a first measured time period $\Delta t$ and a second measured time period $k\Delta t$. To this end, the current measurement circuit 14 is connected at the control terminal Gex to measure the IGBT gate current $I_G$ in response to switching-OFF the power transistor 18. For example, the current measurement circuit 12 may be arranged to measure the rate of change (or slope) of the IGBT gate current $I_G$ by comparing the detected slope (or proxy therefore) to a predetermined reference slope value (e.g., 45 degrees) and keeping track of the time when the gate current reaches the reference slope value. By tracking this information, the current measurement circuit 12 may calculate a first measured time period $\Delta t$ from the initiation of the turn-off sequence at the control terminal until the detection of the predetermined reference slope value for the gate current.

The proportional timer circuit 13 is connected to receive the first measured time period $\Delta t$ from the measurement circuit 14, and to calculate therefrom a second measured time period $k\Delta t$ that is proportional to the first measured time period $\Delta t$. For example, the proportional timer circuit 13 may be arranged to store the first measured transition period $\Delta t$ by charging a capacitor to a first value with a first current I1, and then discharging the capacitor with a second current I2 that is proportional to the charge, thereby adding the first measured time period $\Delta t$ and the second measured time period $k\Delta t$ that is proportional to the initial slope detection time $\Delta t$. By adding a proportional time $k\Delta t$, the proportional timer circuit 13 accounts for variations in the transistor fabrication process and/or temperature parameters. Thus, instead of using a timer circuit or $V_{CE}$ voltage measurement circuit to determine the temporal location of the Miller plateau when the voltage VCE increases with a very low slope, the current measurement circuit 14 measures the IGBT gate current slope to get an initial slope detection time $\Delta t$ for detecting the time that the current slope reaches a predetermined reference slope value, and the proportional timer circuit 13 adds a second measured time period $k\Delta t$ to identify a beginning or intermediate location of the Miller plateau.

The active gate voltage/current control 12 is connected to receive the second measured time period $k\Delta t$, alone or in combination with the first measured time period $\Delta t$. Using this information as a control signal input, the active gate voltage/current control 12 makes a controlled turn-off of the IGBT by reducing or controlling the gate current at a specified time located within the Miller plateau that is computed in a way that takes care of IGBT parameter dispersion. In selected embodiments, the active gate voltage/current control 12 is configured to provide a gate control voltage that transitions from a full turn-on gate control voltage (e.g., +15V for an IGBT transistor) to a full turn-off gate control voltage (e.g., −10V for an IGBT transistor), thereby generating a large IGBT gate current during a first time period (e.g., $k\Delta t$ or $\Delta t + k\Delta t$). However, upon expiration of the first time period, the active gate voltage/current control 12 is configured to reduce the gate current to an intermediate level during the Miller plateau (e.g., from 15 A to 5 A). In this way, the active gate voltage/current control 12 uses the first and/or second measured time periods to reduce the turn-off delay time (by permitting large IGBT gate current during the first and second measured time periods) while also preventing the IGBT from exceeding a specified maximum voltage $V_{CE-MAX}$ (by reducing the IGBT gate current to an intermediate level after the second measured time period).

Figure 3:
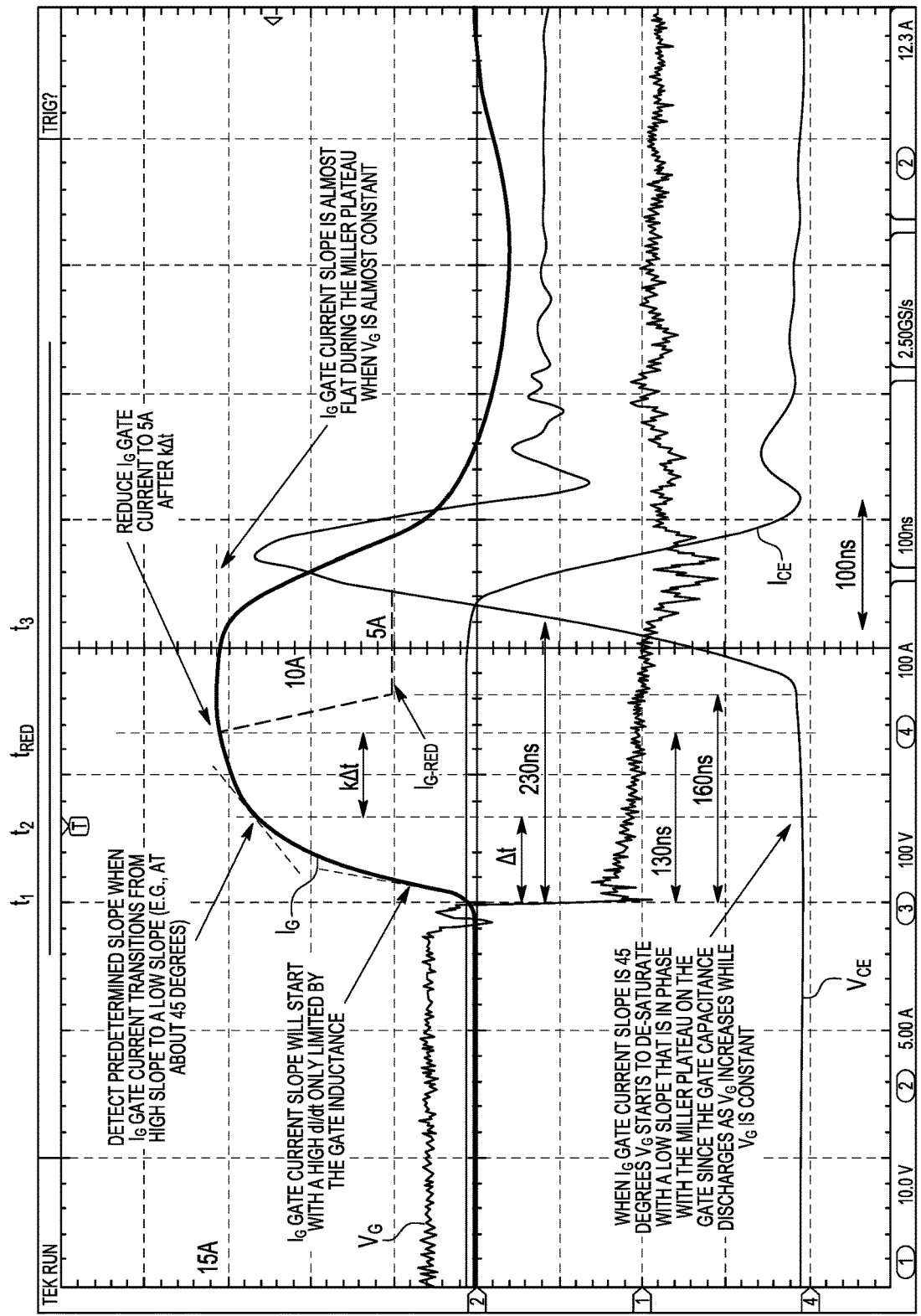
FIG. 3 shows a timing diagram of the voltage and current signals to illustrate how an IGBT gate current slope measurement is used to determine a scaled time delay measure for generating an intermediate gate current during the Miller plateau for controlling the turn-off of the IGBT.

The functionality of the gate drive circuit 11 during turn-off of the IGBT 18 will be explained with reference to the time diagram of FIG. 3 which shows the gate voltage signal $V_G$, collector-to-emitter voltage $V_{CE}$, gate current signal $I_G$, and collector-to-emitter current $I_{CE}$ to illustrate how an IGBT gate current slope measurement is used to determine a scaled time delay measure for generating an intermediate gate current during the Miller plateau for controlling the turn-off of the IGBT in accordance with selected embodiments of the present disclosure.

At time $t_1$, when the gate voltage signal $V_G$ at the drive terminal 11a of the gate drive circuit 11 goes from a high state to a low state, the control terminal Gex is forced to a low state. If the full turn-on gate control voltage is +15V and the full turn-off gate control voltage is −10 V, the output 11a of the gate drive circuit 11 switches from +15 V to −10 V. In response, the gate current IG is generated from the gate-to-emitter capacitor $C_{GE}$ of the power transistor 18 which is discharged through the parasitic resistor $R_G$ 17 and the parasitic inductor $L_G$ 18 which limits the slope of the gate current Ig, i.e., $dI_G/dt$. As depicted, the gate current $I_G$ increases very rapidly (e.g., from 0 A to 15 A) in a short amount of time (e.g., 130 ns). Due to the Miller plateau, the gate current $I_G$ quickly stabilizes at a subsequent point in time (e.g., $t_2$) when the collector-to-emitter voltage $V_{CE}$ begins to de-saturate with a low, linear slope that is in-phase with the Miller plateau. After leaving the Miller plateau, the collector-to-emitter voltage $V_{CE}$ rapidly increases as the gate current IG discharges. In FIG. 3, the rapid increase in the collector-to-emitter voltage $V_{CE}$ begins approximately 160 ns after the gate voltage signal $V_G$ transitions from a high state to a low state. As the collector-to-emitter voltage $V_{CE}$ rapidly increases, the gate is discharged so that the turn off time for the collector-to-emitter current $I_{CE}$ begins at time $t_3$ (which is approximately 230 ns after the gate voltage signal $V_G$ transitions from a high state to a low state) and ends approximately 100 ns later. However, the large gate current $I_G$ used to discharge the gate can rapidly increase the collector-to-emitter voltage $V_{CE}$, resulting in damage to the power transistor 18 if the maximum voltage value $V_{CE\text{-}MAX}$ is surpassed.

To prevent transistor damage while maintaining acceptable turn-off performance by discharging the IGBT gate as fast as possible, the gate current signal $I_G$ is reduced at time $t_{RED}$ to a reduced or lower gate current signal $I_{G\text{-}RED}$. In FIG. 3, the reduction of the gate current IG begins after the second measured time period $k\Delta t$ that is approximately 130 ns after the gate voltage signal $V_G$ transitions from a high state to a low state, and is reduced to an intermediate current level (e.g., approximately 5 A). To prevent device damage from rapid increases in $V_{CE}$, the gate current reduction time $t_{RED}$ should occur during the Miller plateau when $V_{CE}$ increases very slowly. As an approximate measure of this timing, the gate current signal $I_G$ may be evaluated to detect a predetermined slope (e.g., at about 45 degrees) when the slope of the gate current $I_G$ transitions from a high slope to a low slope. In FIG. 3, a first time increment required for the gate current signal $I_G$ to reach this slope is shown as a first measured time period $\Delta t$. To account for variations arising from the device fabrication process and/or temperature parameters, a second time increment is determined by computing a second measured time period (e.g., $k\Delta t$) which is proportional to the first time increment. Since, upon expiration of the second time increment, the slope of the gate current Ig is substantially flat (since this point occurs during the Miller plateau when the gate voltage $V_G$ is almost constant), this time may be used to make a controlled reduction in the IGBT gate current in order to prevent $V_{CE}$ overshoot. In FIG. 3, the gate current reduction time $t_{RED}$, computed as the sum of the first and second time increments, is approximately 130 ns. While reducing the gate current $I_G$ will slow the gate discharge and thereby delay the transistor turnoff (as compared to allowing the unlimited gate current $I_G$ to discharge the gate), the timing of the gate current reduction time $t_{RED}$ may be controlled to take advantage of the Miller plateau up through the second measured time period $k\Delta t$ and then to prevent device damage from $V_{CE}$ overshoot by reducing the gate current $I_G$ after the second measured time period $k\Delta t$ just before $V_{CE}$ goes up.

Figure 4:
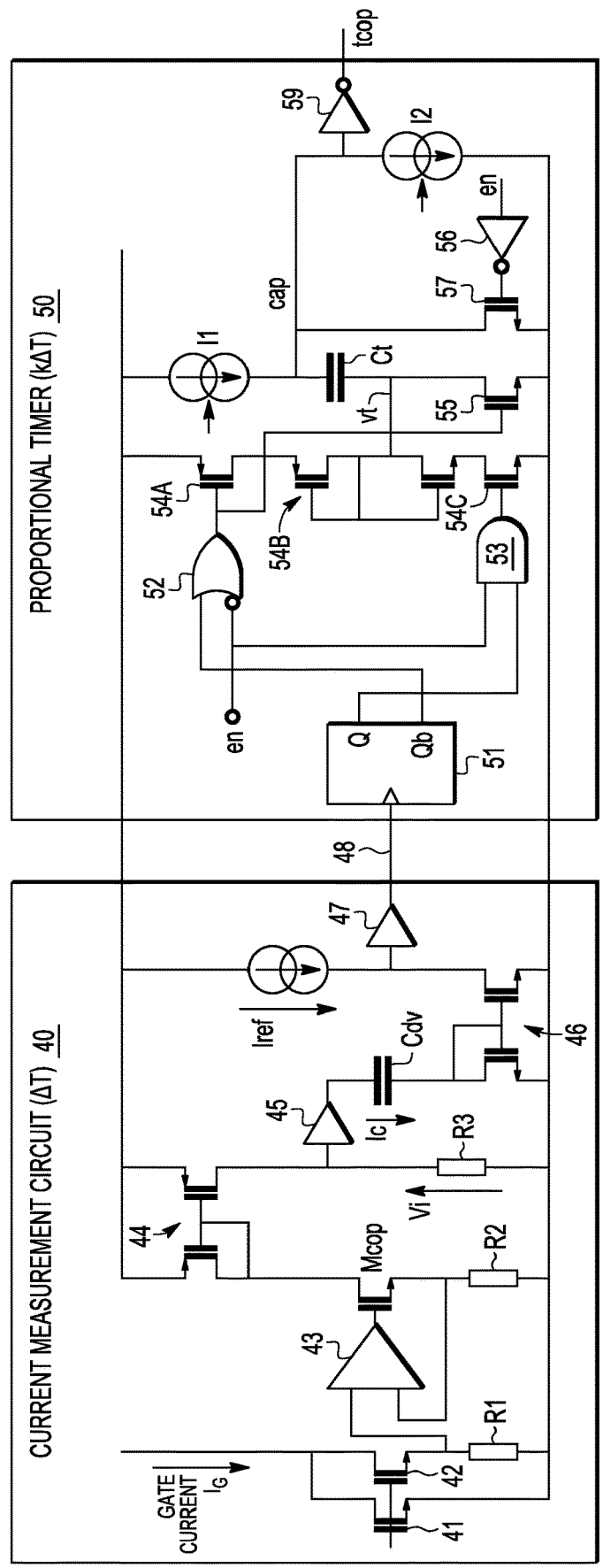
FIG. 4 is a simplified circuit schematic diagram of a current measurement circuit and proportional timer circuit for controlling the generation of an intermediate gate current for the IGBT gate control terminal in accordance with selected embodiments of the present disclosure.

To illustrate example details of selected embodiments of the present disclosure, reference is now made to FIG. 4 which shows a simplified circuit schematic diagram of a current measurement circuit 40 and proportional timer circuit 50 for generating a timing control output signal (tcop) for controlling when a lower or intermediate gate current for the IGBT gate control terminal is generated after a specified delay from the transistor turn-off time ($t_{OFF}$). The disclosed current measurement circuit 40 is connected to measure the input gate current $I_G$ (or a small portion thereof that is proportional to the total input gate current) and detect a time $\Delta t_{up}$ when the gate current reaches a predetermined slope. To this end, the current measurement circuit 40 includes one or more first NMOS transistors 41 which is connected to ground and second NMOS sense transistor 42 which is connected across a first resistor R1 to ground to develop a voltage $V_{R1}$ corresponding to the gate current $I_G$. Though illustrated as a single transistor, the one or more first NMOS transistors 41 may be implemented with a plurality of transistors connected in parallel, each gated with a different buffered power switch control signal. For example, the one or more first NMOS transistors 41 may include a first transistor M1 (connected to provide 10 A) and a second transistor M2 (connected to provide 5 A) connected in parallel and separately gated so that up to 15 A can be provided at the input gate current $I_G$ when both transistors M1, M2 are turned ON, and so that a reduced input gate current $I_G$ of 5 A can be provided when only the second transistor M2 is turned ON.

Figure 5:
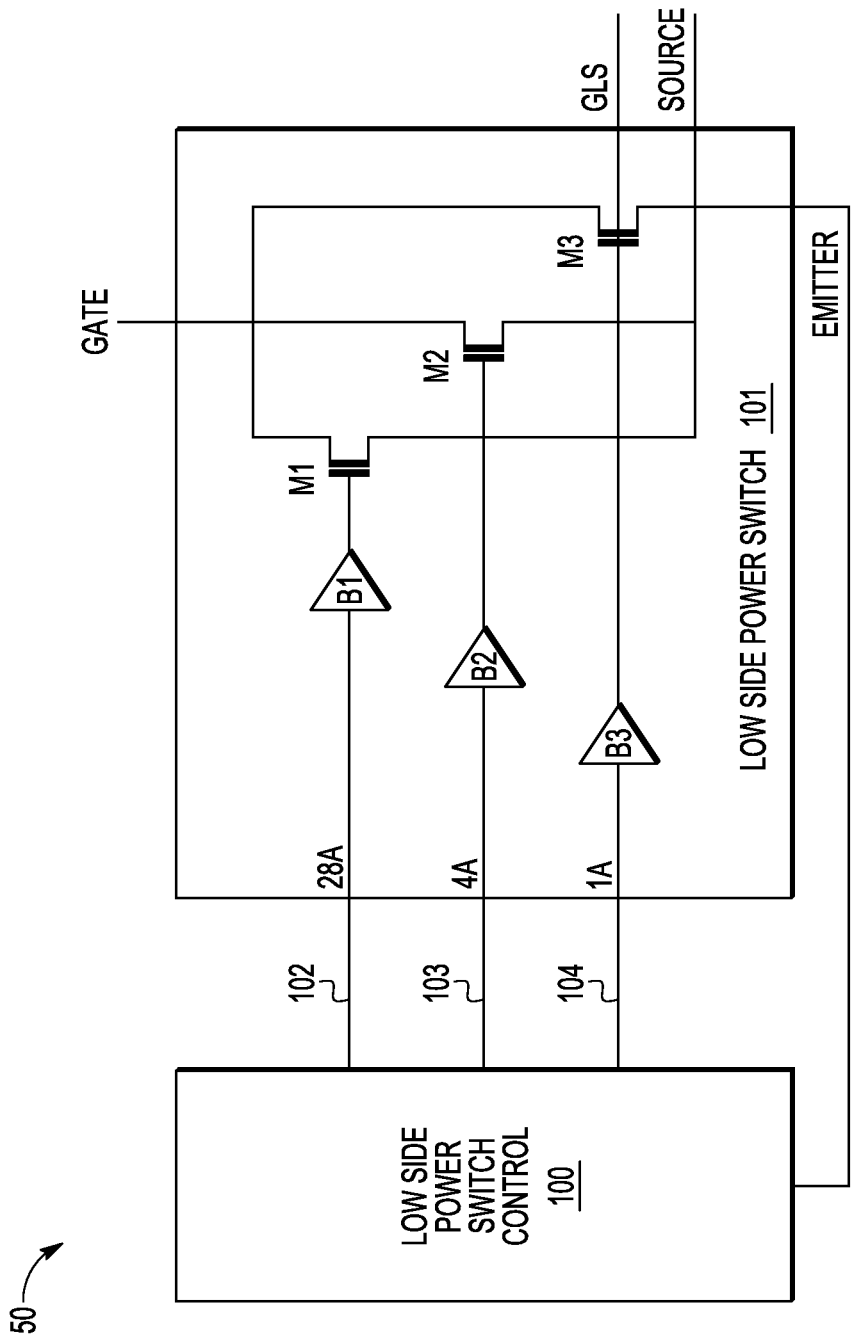
FIG. 5 is a simplified schematic circuit illustration of a low side power switch that is controlled by a low side power switch control.

As will be appreciated, other current switching configurations may be provided to enable different input gate current levels. For example, FIG. 5 shows a schematic circuit illustration 50 of a low side switch implementation of the one or more first NMOS transistors in a low side power switch 101 that is controlled by a low side power switch control 100. As illustrated in FIG. 5, the one or more first NMOS transistors 41 may include a first transistor M1 (connected to provide 28 A), a second transistor M2 (connected to provide 4 A), and a third transistor M3 (connected to provide 1 A) connected in parallel between shared GATE and EMITTER nodes. With each transistor M1-M3 separately gated and controlled by the low side power switch control 100, up to 33 A can be provided as the gate level source (gls) at the input gate current $I_G$ when all three transistors M1, M2, M3 are turned ON. In addition, a first reduced input gate current $I_G$ of 5 A can be provided at the gls output when only the second and third transistors M2, M3 are turned ON. Finally, a second reduced input gate current $I_G$ of 1 A can be provided at the gls output when only the third transistor M3 is turned ON. To control the relative timing of the switching connections in the low side power switch 101, the low side power switch control may be configured to first, second, and third control signals 102-104 which are applied through respective buffers B1-B3 to drive the switching transistors M1-M3 to all be "ON" until expiration of the second time increment, and then to turn "OFF" the first transistor M1 for a set amount of time until both the first and second transistors M1, M2 are turned "OFF," leaving only the first transistor M1 turned "ON." When the third transistor M3 and the second NMOS transistors 42 are gated in common with the same bias gate voltage, the first and second transistors M1, M2 may be used to reduce the gate current during turnoff of the IGBT 18. To this end, the second NMOS transistor 42 may be connected as an emitter sense transistor that is sized as a very small transistor to take just a small part of the total gate current that is proportional to the total gate current.

As illustrated, the output from the second NMOS transistor 42 may be connected to a first sense amplifier 43 which senses the voltage at the first resistor R1 and copies the voltage across an NMOS transistor Mcop to a second resistor R2. The current in the NMOS transistor Mcop is a copy of the $I_G$ gate current. The current measurement circuit 40 also includes a PMOS current mirror 44 which mirrors the current in the NMOS transistor Mcop to a third resistor R3 to thereby generate the voltage Vi which has the same shape as the gate current $I_G$, but in voltage form. Using the follower buffer 45, the voltage Vi drives the capacitor Cdv to generate a current Ic=Cdv×d(Vi)/dt which is therefore proportional to the slope of the $I_G$ gate current (by virtue of the Vi term). At the NMOS current mirror 46, the current Ic is compared with a reference current (Iref), and when there is a match to indicate that the gate current IG has reached the reference slope (e.g., 45 degrees), the output buffer 47 outputs a signal indication 48 corresponding to the first measured time period Δtup which begins discharging the capacitor Ct in the proportional timer circuit 50.

The computation of the first measured time period Δtup is shown in FIG. 5 which depicts a timing diagram 60 of the voltages and currents in the current measurement circuit shown in FIG. 4. As illustrated, the first measured time period Δtup is measured from the transistor turn-off time ($t_{OFF}$) at which point the digital enable signal "en" 61 switches states (e.g., is asserted). The measurement of the first measured time period Δtup continues while the "cap" voltage signal is ramped up as the capacitor Ct is charged by the constant current (I1). The measurement of the first measured time period Δtup ends once the transition/threshold voltage signal vt transitions in response to the output signal indication 48 from the current measurement circuit 40, indicating that the reference slope has been reached by the gate current $I_G$.

In the proportion timer circuit 50, the set/reset latch 51 receives the output signal indication 48 from the current measurement circuit 41 and provides latch outputs Q and Qb to logic circuitry 52-57 which is enabled by the digital enable signal "en". As depicted, the logic circuitry may include an OR gate 52 which is connected to receive the Qb signal and an inverted digital enable signal "en". In addition, the logic circuitry may include an AND gate 53 which is connected to receive the Q and "en" signals. The logic circuitry may also include additional logic circuits and transistors, including PFETs and NFETs 54-55 which generate the transition or threshold voltage signal vt having a transition which corresponds to the timing of the first measured time period Δtup. The logic circuitry may also include an inverter 56 and NFET 57 which are connected to reset the "cap" signal to 0V by turning ON the NFET 57 when the digital enable signal "en" is low, thereby providing a reset function for the capacitor Ct until the turn off starts (toff), at which point the proportional timer circuit 50 is enabled ("en" is high) which turns the reset NFET 56 OFF to allow the capacitor Ct to be charged with a constant current (I1) while the vt signal is connected to ground during the first measured time period Δtup.

In FIG. 5, the operation of the proportional timer circuit 50 is illustrated with the "cap" voltage signal 63 which ramps up during the first measured time period Δtup until the transition/threshold voltage signal vt transitions. Once the predetermined gate current slope is reached, the Vt signal is forced at the inverter threshold and Ct is discharged with a current (I2). As the resulting "cap" signal 63 transitions below the threshold of the inverter 59, the tcop output 62 from the proportional timer 50 is asserted to provide a second measured time period Δtdwn that is proportional to the first measured time period Δtup based on the differences between the constant current source I1 and second current source I2. As a result, the tcop signal 64 effectively generates a negative pulse during the second measured time period Δtdwn, providing a rising transition or pulse signal which may be used to reduce the gate current. As illustrated, the pulse duration for the maximum IGBT gate current in the tcop signal 64 is given by Δtup+Δtdwn.

Figure 6:
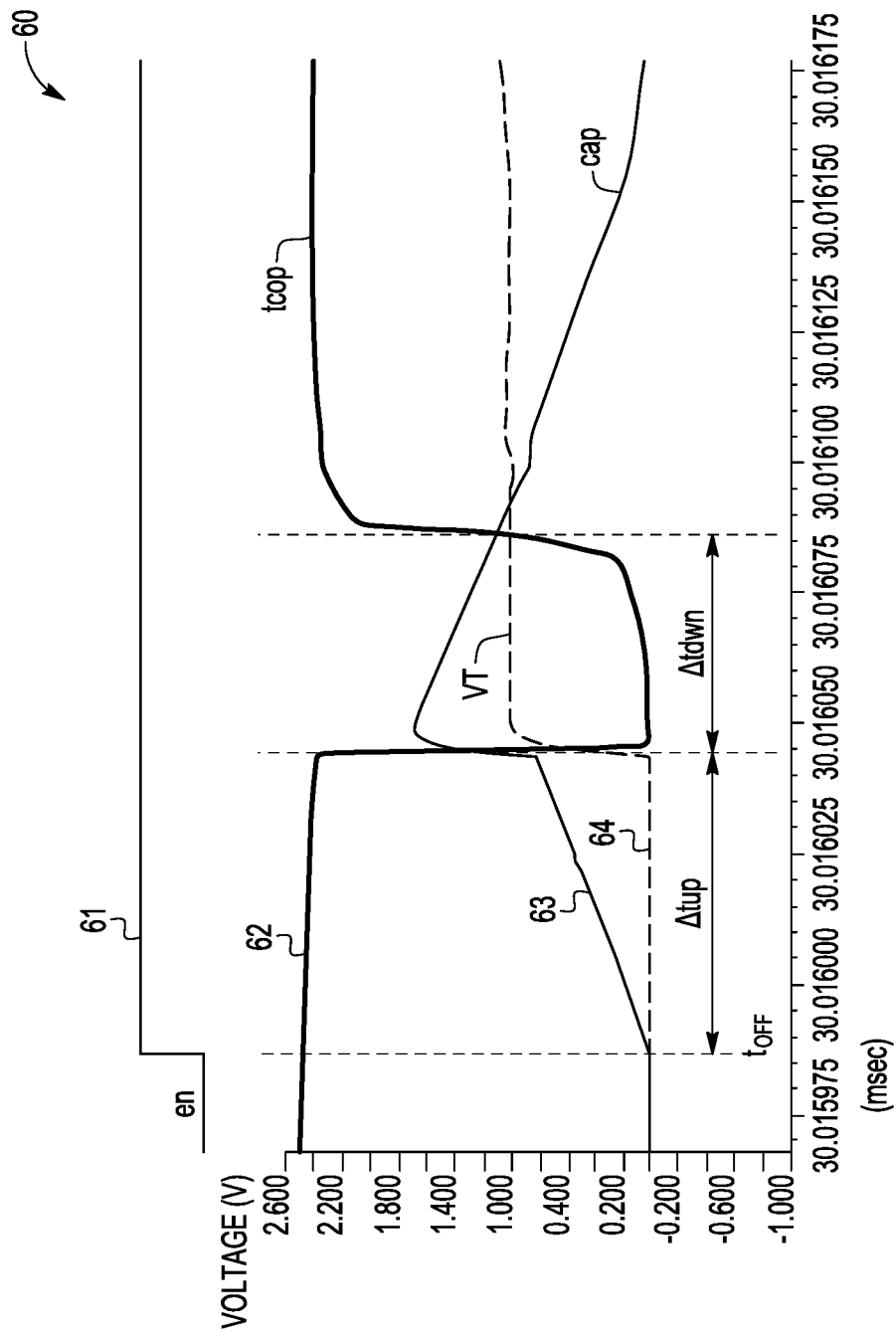
FIG. 6 is a timing diagram of the voltages and currents generated by the current measurement circuit and proportional timer circuit shown in FIG. 4.

To provide additional details for an improved understanding of selected embodiments of the present disclosure, reference is now made to the timing diagram 70 in FIG. 6 which shows an IGBT gate current 71, 71a which is reduced from a high gate current level (e.g., approximately 11 A) to a reduced current (e.g., approximately 5.8 A) after the second measured time period Δtdwn when the slope of the current is almost flat. In other words, the timing control for the maximum IGBT gate current is given by toff+Δtup+Δtdwn, and the IGBT gate current 71 is reduced to a lowest current (e.g., approximately 5.8 A). FIG. 6 also shows the current-to-emitter voltage $V_{CE}$ signal 73 which results from the reduced IGBT gate current 71. For contrast and comparison, FIG. 6 also shows an unadjusted IGBT gate current 71, 71b (dashed line) that is not reduced alongside the corresponding unadjusted VCE signal 72 (dashed line) which would result from the IGBT gate current 71, 71b. As depicted, the VCE signal 73 is delayed with respect to the VCE signal 72 by virtue of having the IGBT gate current reduced since this reduced gate current slows the gate discharge rate. However, this delay also enables the transistor to operate in the Miller plateau, thereby protecting the device against VCE overshoot. As depicted, the VCE signal 72 rises very quickly to the higher voltage (e.g., at least 400V) in this simulation example where the Vsupply voltage is 300V, due to the fact that the device leaves the Miller Plateau region of operation, whereas there is no overshoot with the delayed VCE signal 73.

Figure 7:
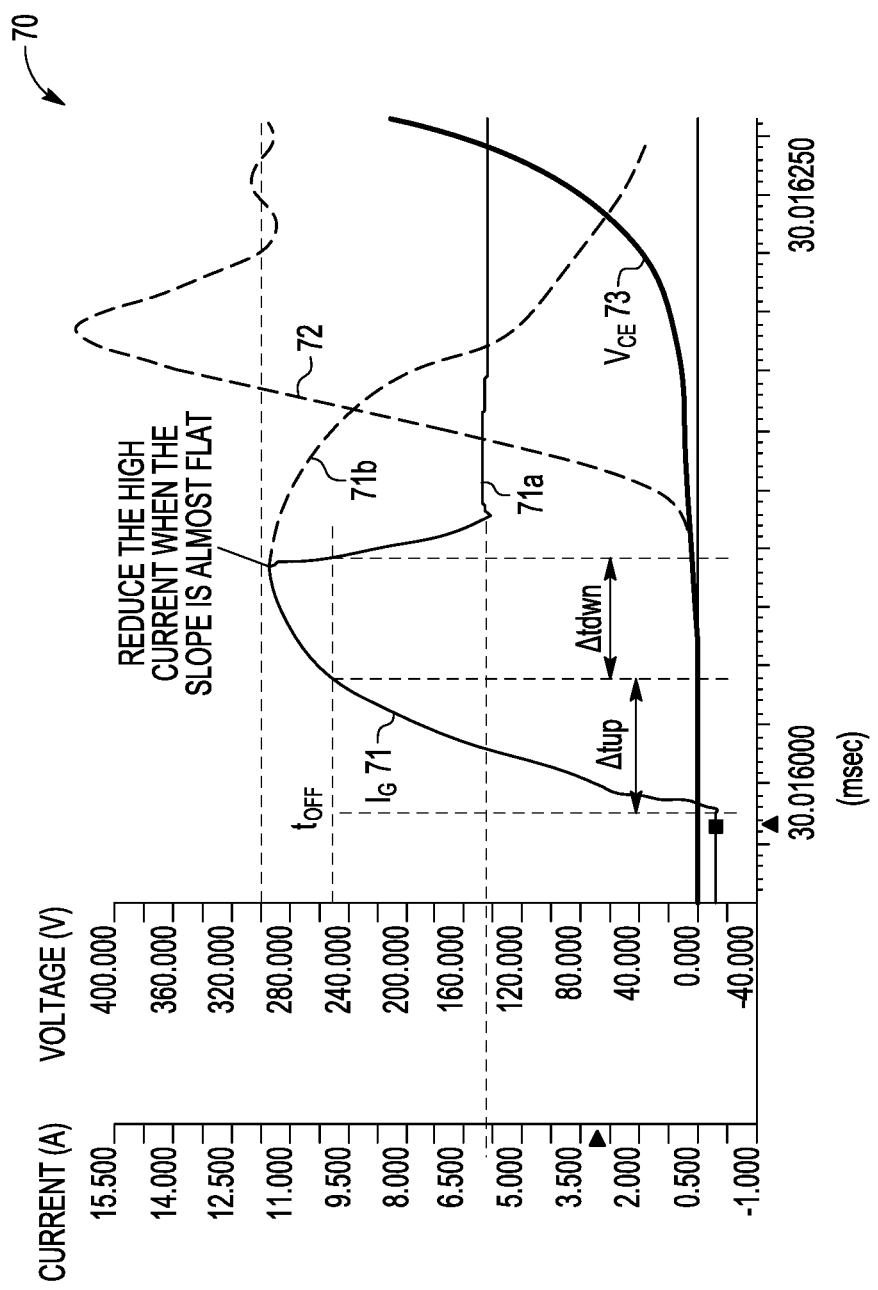
FIG. 7 is a timing diagram illustration of a how an IGBT gate current slope measure can be used to estimate the Miller plateau location for purposes of controlling the reduction the gate current and preventing current-to-emitter voltage overshoot.
Figure 8:
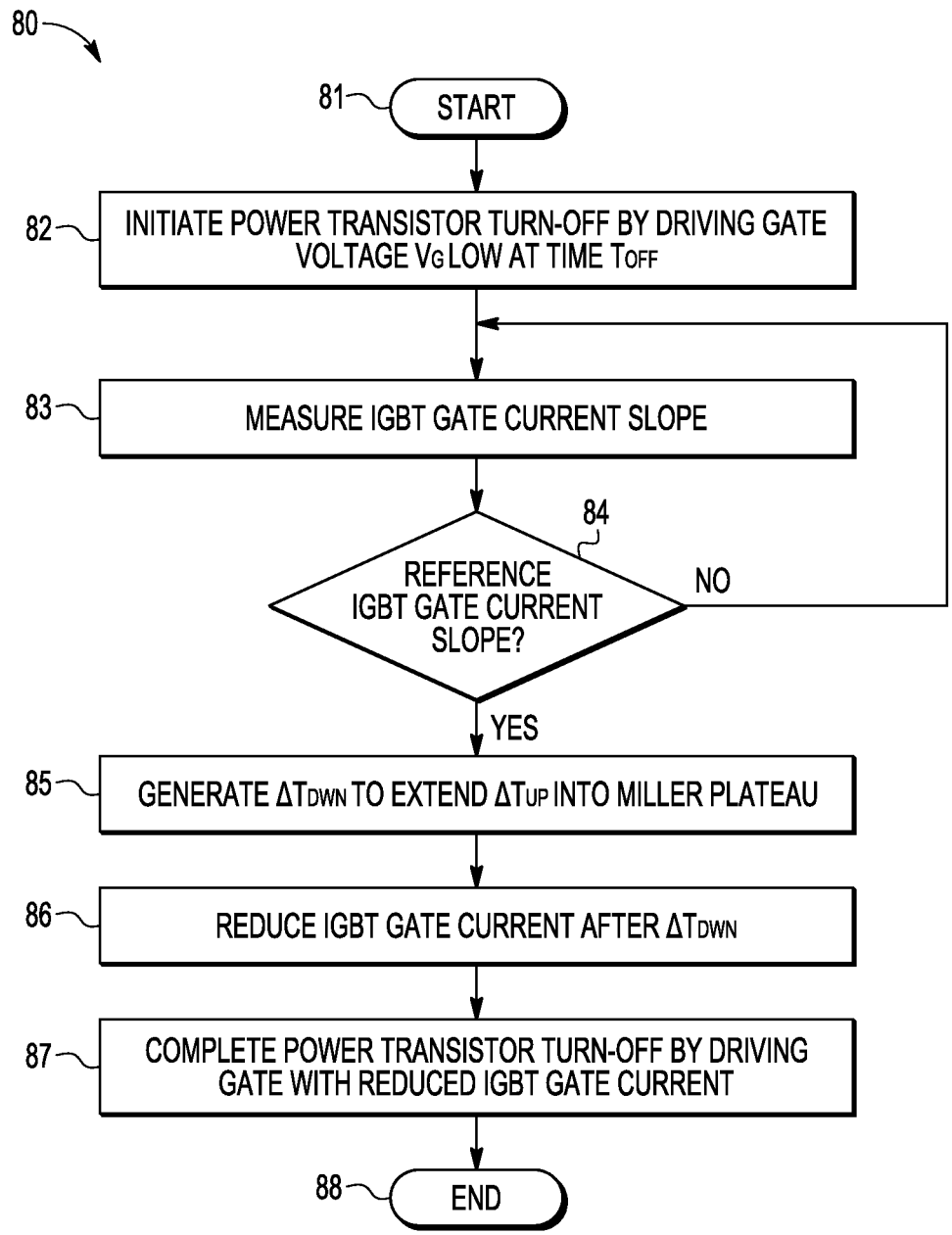
FIG. 8 schematically shows a flow chart of a method of controlling a gate terminal of a power transistor during turn-off of the power transistor.

Turning now to FIG. 7 there is illustrated a simplified flow chart sequence 80 of a software-based method of controlling a gate terminal of a power transistor during turn-off of the power transistor in accordance with selected embodiments of the present invention. At step 81, the method starts and the power transistor turn-off sequence is initiated at time $T_{OFF}$ by driving the gate voltage $V_G$ low at step 82. At step 83, the IGBT gate current is measured, such as by evaluating a slope measure for the IGBT gate current against a reference slope measure. In selected embodiments, the IGBT gate current slope is evaluated in the current measurement circuit 14 of the gate drive circuit 11 shown in FIG. 1. At step 84, the measured IGBT gate current slope is evaluated or compared with a reference IGBT gate current slope so that step 83 continues until such time as the reference slope measure is reached (negative outcome to detection step 84) until such time as the reference slope measure is reached. When the reference slope is reached, the first measured time period Δtup is determined ($\Delta t_{UP}$ outcome to detection step 84). To account for temperature and/or IGBT parameter dispersion, the first measured time period Δtup is extended at step 85 by generating a second measured time period Δtdwn which effectively extends the first measured time period Δtup into the Miller plateau region of operation for the power transistor. Upon expiration of the second measured time period Δtdwn, the IGBT gate current is reduced at step 86, such as by clamping or reducing the IGBT gate current to a specified current level (e.g., from 15 A to 5 A). Thus constrained, the turn-off of the power transistor is completed at step 87 by driving the IGBT gate with the reduced IGBT gate current, and the method ends at step 88.

By now it should be appreciated that there is provided herein a method and apparatus for controlling a drive terminal of a power transistor. In the disclosed methodology and apparatus, a turn-off voltage is applied to the power transistor's drive terminal at a turn-off time, such as by driving the drive terminal from a first voltage (e.g., +15V) to a second lower voltage (e.g., −10V) having a voltage differential of at least 20V with respect to the first voltage. As the gate current develops at the drive terminal in response, the gate current is measured to detect a predetermined gate current slope. In selected embodiments, the gate current is measured as a current slope measure for an Insulated Gate Bipolar Transistor (IGBT) gate current at the drive terminal to detect the predetermined gate current slope. For example, the gate current measurement may be implemented by charging a first capacitor with a buffered voltage which tracks the IGBT gate current until a current at the first capacitor matches a reference current corresponding to the predetermined gate current slope. Upon detecting the predetermined gate current slope, a first time increment after the turn-off time is determined, and then a second time increment is determined which is an extension of the first time increment. For example, the second terminal may be proportional to the first time increment, and may be timed to expire within a Miller plateau for the power transistor. In selected embodiments, the first time increment may be determined by subtracting the turn-off time from a time when the current at the first capacitor matches the reference current corresponding to the predetermined gate current slope. In addition, the second time increment may be determined by charging a second capacitor with a constant current source during the first time increment to obtain a voltage across the second capacitor, and then discharging the second capacitor with a second current source until the voltage across the second capacitor reaches an inverter threshold for an output inverter. Finally, the gate current at the drive terminal is lowered to a predetermined current level upon expiration of the second time increment in order to reduce overvoltages at the power transistor.

In another form, there is provided a gate drive circuit and associated method of operation for driving a control terminal of a power transistor, such as an insulated gate bipolar transistor (IGBT). In the disclosed gate drive circuit, a drive terminal is provided for electrical coupling to the control terminal of the power transistor. In addition, the gate drive circuit includes an active current gate drive circuit for applying a voltage control signal to the drive terminal at a turn-off time and for lowering a control terminal current supplied to the drive terminal to a predetermined current level upon expiration of a time increment which expires within a Miller plateau for the power transistor in order to reduce overvoltages at the power transistor. In selected embodiments, the active current gate drive circuit includes a first reference source for generating a positive reference voltage; a second reference source for generating a negative reference voltage; a third reference source for generating a fixed current; a first switch being arranged to electrically drive, when in an on state, the drive terminal from the positive reference voltage to the negative reference voltage at the turn-off time; and a second switch being arranged to electrically drive, when in an on state, the drive terminal with the fixed current upon expiration of the time increment, thereby lowering the control terminal current supplied to the drive terminal. The gate drive circuit also includes a measurement circuit having a measurement input connected to the drive terminal for measuring a gate current slope at the control terminal, and a measurement output connected to a first input of the active current gate drive circuit for supplying the time increment as a control signal to the active current gate drive circuit to initiate the lowering of the control terminal current to the predetermined current level. In selected embodiments, the measurement circuit includes first and second timer circuits. The first timer circuit is provided for determining a first time increment after the turn-off time when a predetermined gate current slope is detected at the drive terminal. In selected embodiments, the first timer circuit includes a first capacitor that is charged with a buffered voltage to track the control terminal current measured at the drive terminal until a current at the first capacitor matches a reference current corresponding to the predetermined gate current slope, thereby determining the first time increment. The second timer circuit is provided for determining a second time increment which is proportional to the first time increment and which expires within a Miller plateau for the power transistor. In selected embodiments, the second timer circuit includes a second capacitor that is charged with a constant current source during the first time increment to obtain a voltage across the second capacitor, and that is discharged with a second current source until the voltage across the second capacitor reaches an inverter threshold for an output inverter, thereby determining the second time increment.

In yet another form, there is provided a power module having a power transistor (e.g., an IGBT) and active gate drive circuit. In the power module, the power transistor may include an emitter terminal, a collector terminal, and an external gate control terminal connected over a parasitic component to an internal gate terminal. In addition, the active gate drive circuit in the power module may be connected to drive the external gate control terminal of the power transistor by supplying a turn-off voltage to the external gate control terminal at a turn-off time and supplying a reduced gate current to the external gate control terminal upon expiration of time increment which expires within a Miller plateau region of operation for the power transistor in order to reduce overvoltages at the power transistor. In selected embodiments, the active gate drive circuit may include a first reference source for generating a positive reference voltage; a second reference source for generating a negative reference voltage; a third reference source for generating a fixed current; a first switch being arranged to electrically drive the external gate control terminal from the positive reference voltage to the negative reference voltage at the turn-off time; and a second switch being arranged to electrically drive the external gate control terminal with the fixed current upon expiration of time increment, thereby supplying the reduced gate current. The disclosed power module may also include a measurement circuit having a measurement input connected to measure a gate current at the external gate control terminal, and a measurement output connected to the active gate drive circuit for supplying the time increment as a control signal to control when the reduced gate current is supplied to the external gate control terminal. In selected embodiments, the measurement circuit includes first and second timer circuits. The first timer circuit is provided for determining a first time increment after the turn-off time when a predetermined gate current slope is detected at the external gate control terminal, and may include a first capacitor that is charged with a buffered voltage to track the gate current measured at the external gate control terminal until a current at the first capacitor matches a reference current corresponding to the predetermined gate current slope, thereby determining the first time increment. The second timer circuit is provided for determining a second time increment which is proportional to the first time increment and which expires within the Miller plateau region of operation for the power transistor, and may include a second capacitor that is charged with a constant current source during the first time increment to obtain a voltage across the second capacitor, and that is discharged with a second current source until the voltage across the second capacitor reaches an inverter threshold for an output inverter, thereby determining the second time increment. With this arrangement, the measurement circuit supplies the time increment as a sum of the first and second time increments.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and flow charts illustrating design and operational details of a power transistor gate drive control method and apparatus without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention.

Although the described exemplary embodiments disclosed herein are directed to a method and apparatus in which a measure of the IGBT gate current slope is used to control the timing of reducing the IGBT gate current to a reduced current level so as to prevent VCE overshoot while minimizing turn-off time for the power transistor, the present invention is not necessarily limited to the example embodiments which illustrate inventive aspects of the present invention that are applicable to a wide variety of applications. Thus, the particular embodiments disclosed above are illustrative only and should not be taken as limitations upon the present invention, as the invention may be modified and practiced in different but equivalent manners apparent to those skilled in the art having the benefit of the teachings herein. For example, a gate drive circuit as described herein may be used to control a gate current reduction sequence, though because the gate drive circuit for implementing the present disclosure may be composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention. For example, the active gate voltage/current control 12 may be implemented with a switchable current source in many alternative ways known to those skilled in the art. In addition, the connections between electrically coupled devices may be any type of connection suitable to transfer signals from or to the respective nodes, units or devices, for example via intermediate devices. Moreover, the functionality embodied in the current measurement circuit 14 and proportional timer circuit 13 may be combined or re-ordered in a single software or hardware based circuit to achieve the overall timing measurement outcome to generate a reduced gate current within the Miller plateau region of operation for the power transistor. In addition, the process steps may be performed in an alternative order than what is presented. Furthermore, those skilled in the art will recognize that boundaries between the functionality of the above described operations merely illustrative. The functionality of multiple operations may be combined into a single operation, or the functionality of a single operation may be distributed in additional operations. Moreover, alternative embodiments may include multiple instances of a particular operation, and the order of operations may be altered in various other embodiments. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

As disclosed herein, the gate drive control circuit may employ a computer product, computing device, system, method, and apparatus which includes or uses computer program code executable on one or more central processing units or other processing devices to observe the IGBT gate current, detect a time period when a reference gate current slope is reached, and compute therefrom an extended time period for reducing the gate current to a reduced level which will protect against $V_{CE}$ overshoot. As such, the gate drive control may be implemented by way of executable program code stored within a non-transitory computer program. As used herein, the expression non-transitory will be understood to refer to the non-ephemeral nature of the storage medium itself rather than to a notion of how long the stored information itself may persist in a stored state. Accordingly, memories that might otherwise be viewed, for example, as being volatile (such as many electronically-erasable programmable read-only memories (EPROMs) or random-access memories (RAMs)) are nevertheless to be viewed here as being "non-transitory" whereas a signal carrier in transit is to be considered "transitory" notwithstanding that the signal may remain in transit for a lengthy period of time.). In other embodiments, the IGBT gate control may be implemented by microcontroller, microprocessor, advanced RISC machine (ARM) processor, field-programmable gate array (FPGA) and/or ad-hoc hardware (e.g., dedicated silicon solutions) in which the IGBT gate control algorithms are advantageously embodied for more efficient processing and improved computational performance.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for controlling a drive terminal of a power transistor, comprising:
    applying a turn-off voltage to the drive terminal at a turn-off time;
    measuring a gate current at the drive terminal to detect a predetermined gate current slope;
    determining a first time increment after the turn-off time when the predetermined gate current slope is detected;
    determining a second time increment which is an extension of the first time increment; and
    lowering the gate current at the drive terminal to a predetermined current level upon expiration of the second time increment in order to reduce overvoltages at the power transistor.

2. The method of claim 1, where applying the turn-off voltage comprises driving the drive terminal from a first voltage to a second lower voltage having a voltage differential of at least 20V with respect to the first voltage.

3. The method of claim 1, where the second time increment is proportional to the first time increment.

4. The method of claim 1, where the second time increment expires within a Miller plateau for the power transistor.

5. The method of claim 1, where measuring the gate current comprises measuring a current slope measure for an Insulated Gate Bipolar Transistor (IGBT) gate current at the drive terminal to detect the predetermined gate current slope.

6. The method of claim 5, where measuring the gate current comprises charging a first capacitor with a buffered voltage which tracks the IGBT gate current until a current at the first capacitor matches a reference current corresponding to the predetermined gate current slope.

7. The method of claim 6, where determining the first time increment comprises subtracting the turn-off time from a time when the current at the first capacitor matches the reference current corresponding to the predetermined gate current slope.

8. The method of claim 1, where determining the second time increment comprises charging a capacitor with a constant current source during the first time increment to obtain a voltage across the capacitor, and then discharging the capacitor with a second current source until the voltage across the capacitor reaches an inverter threshold for an output inverter.

9. A gate drive circuit for driving a control terminal of a power transistor, the gate drive circuit comprising:
    a drive terminal for electrical coupling to the control terminal;
    an active current gate drive circuit for applying a voltage control signal to the drive terminal at a turn-off time and for lowering a control terminal current supplied to the drive terminal to a predetermined current level upon expiration of a time increment in order to reduce overvoltages at the power transistor; and
    a measurement circuit having a measurement input connected to the drive terminal for measuring a gate current slope at the control terminal, and a measurement output connected to a first input of the active current gate drive circuit for supplying the time increment as a control signal to the active current gate drive circuit to initiate the lowering of the control terminal current to the predetermined current level.

10. The gate drive circuit of claim 9, where the active current gate drive circuit comprises:
    a first reference source for generating a positive reference voltage;
    a second reference source for generating a negative reference voltage;
    a third reference source for generating a fixed current;
    a first switch being arranged to electrically drive, when in an on state, the drive terminal from the positive reference voltage to the negative reference voltage at the turn-off time; and
    a second switch being arranged to electrically drive, when in an on state, the drive terminal with the fixed current upon expiration of the time increment, thereby lowering the control terminal current supplied to the drive terminal.

11. The gate drive circuit of claim 9, where the measurement circuit comprises:
    a first timer circuit for determining a first time increment after the turn-off time when a predetermined gate current slope is detected at the drive terminal;
    a second timer circuit for determining a second time increment which is proportional to the first time increment and which expires within a Miller plateau for the power transistor.

12. The gate drive circuit of claim 11, where the first timer circuit comprises a first capacitor that is charged with a buffered voltage to track the control terminal current measured at the drive terminal until a current at the first capacitor matches a reference current corresponding to the predetermined gate current slope, thereby determining the first time increment.

13. The gate drive circuit of claim 11, where the second timer circuit comprises a second capacitor that is charged with a constant current source during the first time increment to obtain a voltage across the second capacitor, and that is discharged with a second current source until the voltage across the second capacitor reaches an inverter threshold for an output inverter, thereby determining the second time increment.

14. The gate drive circuit of claim 9, where the time increment expires within a Miller plateau for the power transistor in order to reduce overvoltages at the power transistor.

15. The gate drive circuit of claim 9, where the power transistor comprises an insulated gate bipolar transistor.

* * * * *